United States Patent [19]

Ikeda

[11] Patent Number: 4,942,279
[45] Date of Patent: Jul. 17, 1990

[54] RF INDUCTION HEATING APPARATUS FOR FLOATING-ZONE MELTING

[75] Inventor: Yasuhiro Ikeda, Annaka, Japan

[73] Assignee: Shin-Etsu Handotai Co., Ltd., Tokyo, Japan

[21] Appl. No.: 456,203

[22] Filed: Dec. 20, 1989

Related U.S. Application Data

[63] Continuation of Ser. No. 186,290, Apr. 26, 1988, abandoned.

[30] Foreign Application Priority Data

| May 25, 1987 | [JP] | Japan | 62-125801 |
| May 25, 1987 | [JP] | Japan | 62-125802 |
| May 25, 1987 | [JP] | Japan | 62-125803 |

[51] Int. Cl.⁵ .............................................. H05B 6/40
[52] U.S. Cl. ................................ 219/10.75; 219/10.43;
219/10.79; 156/604; 156/620.72; 156/620.73; 373/139
[58] Field of Search ............ 219/10.43, 10.491, 10.75, 219/10.79; 373/139; 156/620.7, 617.1, 620.72, 620.73, 604, 600

[56] References Cited

U.S. PATENT DOCUMENTS

| 3,601,569 | 8/1971 | Keller | 219/10.43 |
| 3,607,138 | 9/1971 | Keller | 219/10.75 |
| 3,725,630 | 4/1973 | Gagliardi | 219/10.79 |
| 3,827,017 | 7/1974 | Keller | 219/10.79 X |
| 4,110,586 | 8/1978 | Köhl et al. | 219/10.43 |
| 4,220,839 | 9/1980 | De Leon | 219/10.43 |
| 4,538,279 | 8/1985 | Keller | 373/139 |
| 4,797,525 | 1/1989 | Keller | 219/10.79 |

FOREIGN PATENT DOCUMENTS

| 1317786 | 1/1963 | France | 219/10.43 |
| 1230726 | 5/1971 | United Kingdom | 219/10.43 |

*Primary Examiner*—Philip H. Leung
*Attorney, Agent, or Firm*—Foley & Lardner, Schwartz, Jeffery, Schwaab, Mack, Blumenthal & Evans

[57] ABSTRACT

An RF induction heating apparatus for manufacturing single-crystal semiconductors having large diameters using the floating-zone melting process is provided in which a single turn induction heating coil suitable for zone melting and another heating coil suitable for controlling single-crystal growth are concentrically or eccentrically positioned to surround an outer surface of a floating zone in a crystalline semiconductor rod. Either the upper or lower peripheral edge of the outer surface of the single-turn induction heating coil is surrounded by and coupled to a annular collar, while both ends of the collar are arranged opposite each other across a gap. At least one conductive sector plate is affixed to a coil lower surface opposite a region of the semiconductor to be heated, so that even if both ends of the coil are spaced apart from each other due to the presence of a supply tube or the like, any gap between the two ends is shielded by the conductive sector plate(s).

8 Claims, 7 Drawing Sheets

RF INDUCTION HEATING APPARATUS FOR FLOATING-ZONE MELTING

This application is a continuation of application Ser. No. 186,290, filed Apr. 26, 1988, now abandoned.

BACKGROUND OF THE INVENTION

1. Field of the Invention

The present invention relates to an RF induction heating apparatus used for a floating-zone melting process for purifying semiconductors and manufacturing dislocation-free, single-crystal semiconductor rods, the semiconductors being of a single-element or compound, by zone-melting a rod-like semiconductor in an axial direction thereof using one or a plurality of heating coils surrounding the rod-like semiconductor.

2. Description of the Prior Art

Conventional RF induction heating apparatuses for purifying semiconductors and manufacturing dislocation-free, single-crystal semiconductor rods, the semiconductors being of a single-element or compound, using a Floating Zone (to be referred to as FZ hereinafter) process are known. A heating apparatus of this type, for example, in a single-crystal semiconductor manufacturing apparatus, is designed to manufacture a rod-like single-crystal semiconductor in such a manner that a rod-like polycrystalline material is held at the bottom of an upper shaft of the apparatus and a single-crystal seed having a small diameter is held at the top of a lower shaft thereof, one end of the polycrystalline material is melted by an RF induction heating coil surrounding the polycrystalline material and nucleated on the single-crystal seed, and then the semiconductor rod is zone-melted by relatively rotating the coil and the polycrystalline material and relatively moving them in the axial direction while a dislocation-free crystal is obtained epitaxially from the seed.

Therefore, in the apparatus of this type, in order to melt the rod-like polycrystalline material to its core within a floating zone for a short period of time, a magnetic field generated by the heating coil need be concentrated and applied to a narrow region. On the other hand, in order to homogeneously grow a single-crystal semiconductor during the zone melting without local variations in impurity, an intensity of the magnetic field to be applied to a growing interface of a single crystal with the melting zone need be controlled so as to moderately heat the growing interface, thereby moderating (delaying) heat dissipation. For this reason, conventionally, a flat single-turn heating coil is used in the RF induction heating apparatus while inner and outer diameters, a sectional shape, and the like of the heating coil are selected to optimize melting of the zone and heat control during melting the single-crystal semiconductor.

However, in the recent years, as a diameter of a single-crystal semiconductor ingot in industrial use is increased, a magnetic field need be concentrated on the melting zone while the magnetic field is applied to a narrower region to stabilize the melt of the melting zone and increase heating efficiency. In addition, in order to prevent steep changes in temperatures of the solidified portion in the vicinity of the growing interface in the axis of the single-crystal semiconductor rod, an intensity of magnetic field to be applied to the solidified portion need be controlled so that the heat can be dissipated moderately. It has been more and more difficult to make such both effects compatible with each other using a single heating coil with an increase in the diameter.

Especially, in an apparatus for manufacturing single-crystal semiconductors having a large diameter, a flat single-turn heating coil has been widely used because of its various advantages, e.g., easy zone-melting of a narrow region of a semiconductor rod, a larger current at a lower voltage applied, and hence prevention of electric discharge. However, when the thickness of such a flat single-turn heating coil and its inner diameter are decreased to improve magnetic field concentration on a floating zone, it becomes more difficult to optimize an intensity of the magnetic fields between the melting zone and the solidified portion interfacing thereto.

Figure 9:
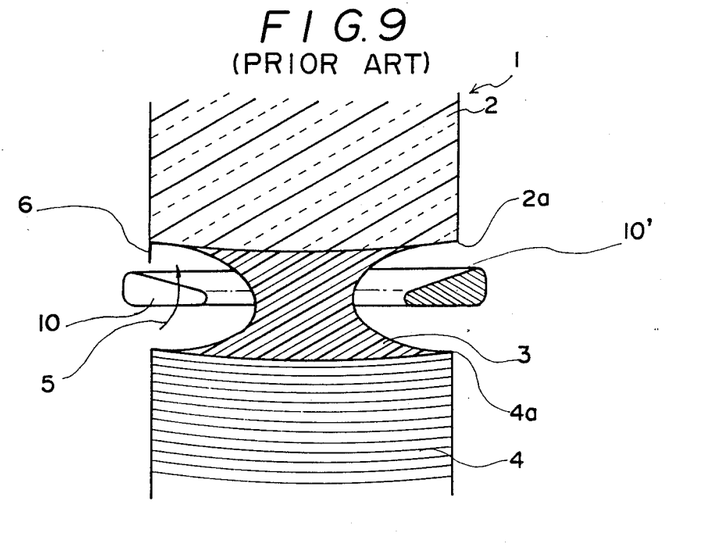
FIG. 9 is a schematic elevational view partially in cross section showing a positional relationship between a conventional RF induction heating coil and a semiconductor rod.

In general, since single-crystal semiconductors are manufactured using the FZ process in a protective gas atmosphere using argon gas or the like, a swift motion of gas flow 5 is generated near a surface of a melting zone 3 of the semiconductor rod 1, as shown in FIG. 9. In addition, since in the flat single-turn heating coil, both ends of the coil, which face to each other with a gap spaced in a predetermined distance, the gas flow 5 passes through the gap and around the outer peripheral surface of the coil, and directly collides with a peripheral edge portion 2a of polycrystalline material 2. As a result, the collided portion is locally cooled and a non-melted portion may be left.

In the above-described FZ process, since the melting zone 3 sequentially produces a single crystal in the form of the thin layer per revolution of the semiconductor rod 4, if the nonmelted portion is generated, as described above, the nonmelted portion is sequentially left to grow an icicle-like "overhang" 6.

If the "overhang" 6 is formed, when the coil 10' is moved up to a polycrystalline heating region 4, the coil 10' collides with the "overhang" 6, and hence the coil cannot pass thereby, resulting in an interruption of the manufacture at this position.

SUMMARY OF THE INVENTION

The present invention has been made in consideration with the above drawbacks of the conventional techniques, and has as its object to provide an RF induction heating coil capable of manufacturing a single-crystal semiconductor having a large diameter and high quality while efficiently performing zone melting and single-crystal growth, and reducing variations in the resistivity distribution.

It is another object to provide an RF induction heating apparatus capable of solving various manufacturing problems, e.g., nonuniformity in magnetic field and occurrence of the "overhang" later described, when a plurality of coils are concentrically arranged.

It is still another object to provide an RF induction heating coil wherein even when an outer diameter of a coil is dimensionally limited by the presence of another coil surrounding its outer periphery or the like, concentration of a magnetic field to be applied to a floating zone can be easily controlled by arbitrarily selecting an outer diameter of the innermost coil.

It is still another object to provide an RF induction heating coil wherein even when a coil is displaced in the peripheral direction by a distance while its both ends being spaced apart from each other by a predetermined width assurance of a space for disposing various members to be attached to the coil such as a power supply tube, magnetic leakage can be prevented at the gap, electromagnetic coupling is not degraded, and moreover, nonuniformity in magnetic field due to the presence of the power supply tube does not appear.

Other objects of the present invention will be further apparent from the following descriptions of the constitution and effect of the invention, and the embodiments.

Figure 1A:
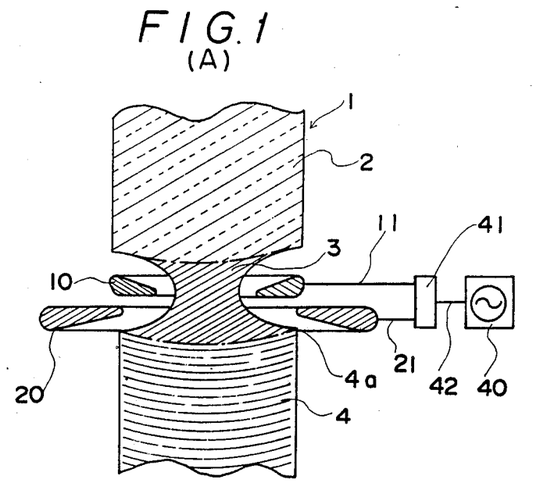
FIGS. 1(A), 1(B), and 1(C) are schematic views showing a basic arrangement of a first aspect according to the present invention, respectively.
Figure 1B:
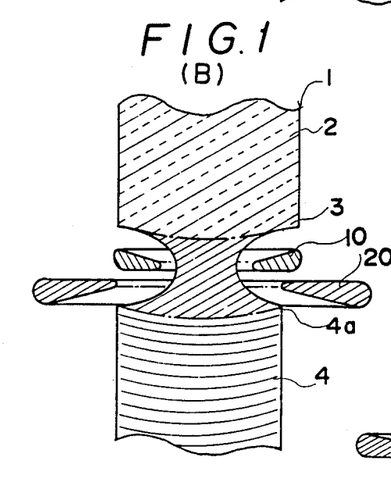
Figure 1C:
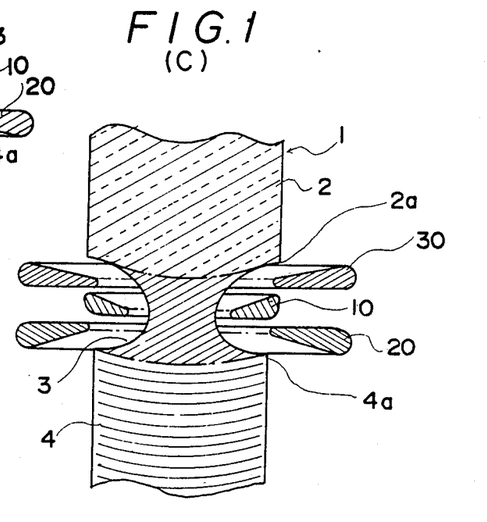

According to a first aspect of the present invention, in order to solve the above-described technical problems, for example, as shown in FIGS. 1(A), 1(B), and 1(C), an RF induction heating apparatus is proposed as follows. A plurality of heating coils 10 and 20 are connected to an RF power supply 40 in parallel and are fed a synchronized RF current. The first heating coil 10 (to be referred to as an inner coil 10 hereinafter) which is arbitrarily selected from the plurality of heating coils is formed by a single-turn coil having an inner diameter smaller than an outer diameter of a polycrystalline material 2 and preferably disposed to be concentrical with the polycrystalline material 2, while the second heating coil 20 (to be referred to as an outer coil 20 hereinafter) which is arbitrarily selected from the plurality of heating coils is formed by a coil having an inner diameter larger than that of the inner coil 10 and arranged to allow its inner peripheral edge side to oppose a peripheral edge portion 4a of the single-crystal rod adjacent to the floating zone 3.

In this case, the outer coil 20 is not limited to a single-turn heating coil like the inner coil 10, but may be formed by a multiple-turn coil.

Note that in order to oppose the inner peripheral edge side of the outer coil 20 to the peripheral edge portion 4a, for example, the outer coil 20 may be positioned a bit under the inner coil 10 while the inner diameter of the coil 20 is chosen to be slightly larger than the diameter of the peripheral edge portion 4a. As a result, the magnetic field of the outer coil 20 can be easily concentrated on the peripheral edge portion 4a (shoulder portion).

Furthermore, the inner coil 10 and the outer coil 20 may be concentrically positioned, or the outer coil 20 may be positioned to be radially eccentric with respect to the inner coil 10.

According to the first aspect of the present invention, the inner and outer coils are arranged to serve for different purposes, i.e., the heating coil 10 most suitable for zone melting and the heating coil 20 most suitable for controlling a temperature gradient in the vicinity of a growing front of a grown single-crystal semiconductor rod can be selected, and induction currents flowing through the coils 10 and 20 can be independently controlled, so that the heating apparatus can easily cope with an increase in diameters of single-crystal ingots, thereby stabilizing the quality of the products.

More specifically, in the inner coil 10, the floating zone 3 of the polycrystalline material 2 can be efficiently zone-melted to the core for a short period of time by decreasing the thickness and the diameter.

In the outer coil 20, heat control can be performed while minimizing a change in temperature in the radial direction of the growing interface of the grown single-crystal rod 4 by causing the inner peripheral edge side of the outer coil 20 to oppose the peripheral edge portion 4a of the grown single-crystal rod. As a result, the curvature of a growth interface between the floating zone 3 and the grown single-cystal rod 4 becomes flat, and a radial impurity distribution curve becomes flat, thereby improving a radial resistivity distribution of the grown single-crystal rod 4.

In order to quickly melt the narrower region corresponding to the zone 3, a considerably larger current need be supplied to the inner coil 10 as compared with the outer coil 20. However, if such a larger current is supplied, a spark discharge is caused between the inner and outer coils 10 and 20, so that the quality of the single-crystal product is in one case degraded or the melting zone process is interrupted in another.

For this reason, in the first aspect of the present invention, a single-turn heating coil is used at least for the inner coil 10 so that a larger current can flow at a lower voltage, thereby preventing the spark discharge.

In a preferred embodiment of the first aspect of the present invention, a vertical length of the floating zone 3 can be set to be longer by shifting the outer coil 20 to be radially eccentric with respect to the inner coil 10, thereby reducing variations in the radial resistivity distribution of the grown single-crystal rod (refer to FIG. 1(B)).

In the preferred embodiment of the first aspect of the present invention, the outer coil 20 is formed by a single-turn heating coil while its inner diameter is set to be slightly larger than the outer diameter of the peripheral edge portion 4a of the grown single-crystal rod 4 so that the concentrated magnetic field can be applied to the peripheral edge portion, thereby promoting the effect of the present invention.

Furthermore, in the preferred embodiment of the first aspect of the present invention, since the heating coils 10 and 20 are parallelly connected to a common RF power supply 40, synchronized RF currents flow through the coils 10 and 20. Therefore, even if the coils are positioned in close proximity to each other, there is no possibility for generating disturbance of the magnetic field between them.

Note that in this case, an impedance of the inner coil 10 can be set higher than that of the outer coil 20 to allow a larger current to flow through the inner coil 10, thereby further promoting the effect of the present invention.

In the first aspect to the present invention, although the coils 10 and 20 can be connected in series with the common RF power supply 40, this is not preferable because a potential difference between the coils or between the single-crystal semiconductor 3 and the polycrystalline material rod 2 is increased.

Note that the number of coils is not limited to two, but can be three or four. For example, in addition to the inner and outer coils 10 and 20, a third single-turn induction heating coil may be used which has an inner diameter larger that that of the inner coil 10 and is capable of heating the peripheral edge portion 2a (FIG. 1(c)) of the polycrystalline material 2 which is in contact with the floating zone 3 so as to preheat the peripheral edge portion 2a of the polycrystalline material 2, thereby quickly and stably performing zone-melting using the inner coil 10, and preventing the "overhang" phenomenon in which a nonmelted portion hangs down from the peripheral edge portion 2a of the polycrystalline material 2 in the form of an icicle.

In the FZ process, an intensity of a magnetic field generated by the heating coil is limited. When the diameter of the polycrystalline material is increased, a melting zone need be narrowed and degradation in heating efficiency of the coil must be prevented.

For this reason, in the first aspect of the present invention, in order to manufacture a single-crystal ingot having a large diameter, the inner and outer coils 10 and 20 should be arranged substantially on a single plane. However, the following drawbacks will be posed in the case.

That is, if the inner and outer coils 10 and 20 are arranged on a single plane, the outer diameter of the inner coil 10 is undesirably limited in size by the inner diameter of the outer coil 20, so that the width of the coil 10 is limited smaller and the RF current cannot be increased sufficiently at a low voltage applied without discharge. Consequently, the intensity of the magnetic field of the inner coil 10 is not large enough to form the melting zone in the semiconductor rod.

Figure 7:
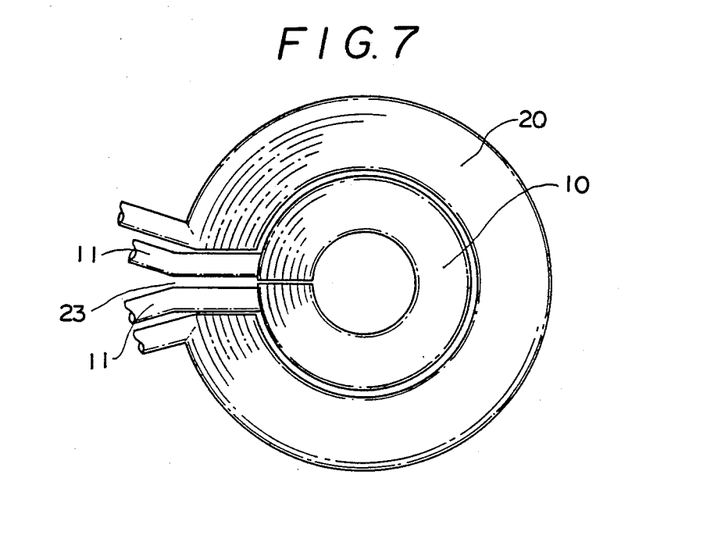
FIG. 7 is a schematic plan view showing the first aspect wherein the problems to be solved in the third aspect are disclosed.

If the inner and outer coils 10 and 20 are arranged substantially on a single plane, as shown in FIG. 7, a gap between both ends of the outer coil 20 cannot be brought in close proximity to each other because of the presence of inner power supply tubes 11 extending from an outer wall of the inner coil 10. As a result, irregularity in the magnetic field occurs in the gap 23, and induction heating effect is degraded there. In addition, the irregularity in the magnetic field in the gap 23 tends to be exaggerated by the inner power supply tubes 11.

Figure 2:
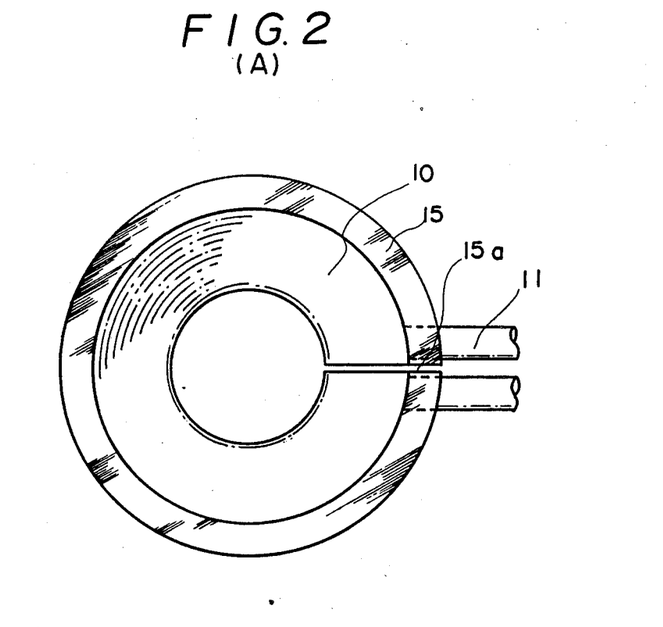
FIG. 2(A) is a plan view.
FIG. 2(B) is a cross-sectional front view thereof.
FIG. 2(C) is a plan view and FIG. 2(D) is an elevational view.

Therefore, according to a second aspect of the present invention, as shown in FIGS. 2(A), 2(B), and 2(C), there is proposed a single-turn induction heating coil used for the FZ process and serving as an indispensable constituent component, that is, either of whose upper and lower edges of the coil 10 surface is indispensably surrounded by and coupled with ring-like collar 15 or 16, and both ends of the collars 15 and 16 are positioned to oppose each other with gaps 15a and 16a, respectively.

In this case, the gap between the both ends radially extends as shown in FIG. 2(A), or may be inclined in the peripheral direction as shown in FIG. 2(C).

According to the second aspect of the present invention, for example, as in the inner coil 10 of the first aspect, even if the outer diameter of the inner coil 10 is limited by the presence of the outer coil 20 positioned outside on the outer peripheral of the coil 10, since the ring-like collars 15 and 16 can extend from the outer peripheral edge of the inner coil 10 in the plane of either of the upper or lower surface of the outer coil 20, an effective outer diameter of the inner coil 10 can be increased. Besides, the thickness of the inner coil 10 can be easily decreased, so that the magnetic field concentration in the melting zone can be improved. Accordingly, the diameter of the single-crystal product can be easily increased.

Furthermore, according to a preferable embodiment of the second aspect of the present invention, the outer diameters of the collars 15 and 16 are set to be larger than that of the polycrystalline material 2 to be melted so that a magnetic field concentrates narrowly at the peripheral edge portion of the polycrystalline material 2. As a result, only a portion near the peripheral edge portion 2a (shoulder portion) of the polycrystalline material can be heated so that the shoulder portion 2a of the polycrystalline material can be regularly melted. Accordingly, so-called preheat can be effectively utilized so as to improve heat efficiency of the floating zone.

Still furthermore, according to the preferred embodiment of the second aspect, the outer diameters of the collars 15 and 16 are set to be larger than the inner diameter of the second coil 20 surrounding the outer peripheral edge of the inner coil 10 so as to shield the gap formed between the coils 10 and 20, thereby preventing the "overhang" which is generated as the result of the phenomenon that the swiftly moving gas 5 collides directly with the peripheral edge portion 2a of the polycrystalline material.

Figure 8:
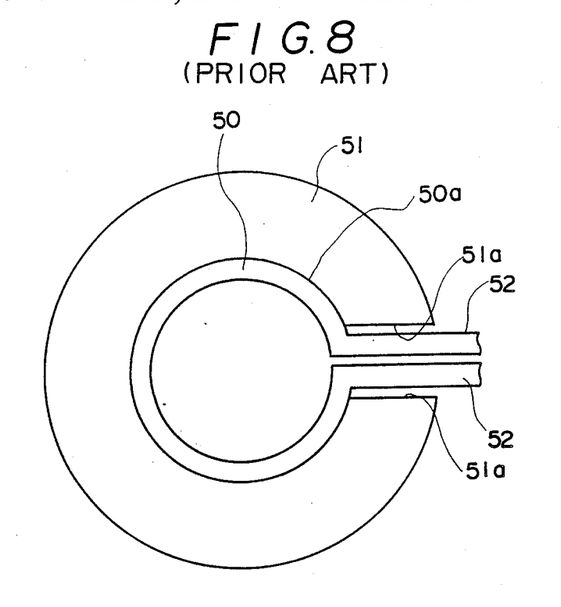
FIG. 8 is a plan view of a conventional heating coil.

As a technique similar to the second aspect, for example, there is disclosed a technique wherein a ring-like collar 51 is disposed around a top portion 50a of a tubular single-turn coil 50 as shown in FIG. 8 (Japanese Unexamined Patent Publication (Kokai) No. 58-82492). However, in such a technique, since the ring-like collar 51 is coupled to the top portion 50a of the coil, both end faces 51a of the collar 51 cannot be positioned in close proximity to each other because of power supply tubes 52 extending outward from the both ends of the coil 50. Inevitably, a nonuniform magnetic field is generated at a portion where the power supply tubes 52 extend between the both end faces 51a of the collar and induction heating efficiency is degraded. In this state, if zone melting of a polycrystalline material is performed using the coil 50, variations in macroscopic and microscopic resistivity distributions are caused in a single-crystal product, and hence a single-crystal product having high quality cannot be manufactured.

Furthermore, in the arrangement wherein the ring-like collar 51 is disposed to the top portion 50a of the coil 50, if an outer coil is present outside the outer periphery of the coil 50, the diameter of the collar 51 cannot be further increased because of the presence of the outer coil, and hence the above-described effect of the present invention cannot be realized at all.

On the other hand, according to the second aspect, in addition to the effects described above, since either of edges of the upper and lower surfaces of the coil is surrounded by and coupled with ring-like collars, both ends of the collars 15 and 16 can be positioned in close proximity to each other without being interfered by the power supply tubes 11, thereby preventing the nonuniform magnetic field from being generated, or preventing degradation in induction heating efficiency.

In this case, it is apparent that a more uniform magnetic field can be formed in a case shown in FIG. 2(C) wherein the gap between the both ends of the collar 16 is inclined in the peripheral direction than in a case shown in 2(A) wherein the gap in the collar 15 is formed in the radial direction.

In a third aspect of the present invention, in order to eliminate the drawback, i.e., that the gap between the both ends of the outer coil 20 cannot be positioned in close proximity to each other because of the inner power supply tubes extending from the outer wall of the inner coil 10, there is proposed a single-turn induction heating coil, as shown in FIGS. 3 to 6, wherein part of a single or plurality of conductive sector plates 24A and 24B are fixed approximately at peripheral surface 20a of a coil so that a space 23 between the both ends 20b of the coil 20 can be substantially sealed by the sector plates 24A and 24B.

In this case, preferably the sector plates 24A and 24B are shaped with substantially the same range of a slightly smaller curvature than those of the peripherals of coil 20, and confined dimensionally within the coil 20. In order to effectively close the space 23 using the sector plates 24A and 24B, the pair of conductive sector plates 24A and 24B extend from the both end faces of the coil toward the space 23 and the both ends 20b may be positioned to oppose each other closely at the center line in the plan of the space 23 with a slit 25 (refer to FIG. 3), or can be inclined in the peripheral direction.

Figure 3:
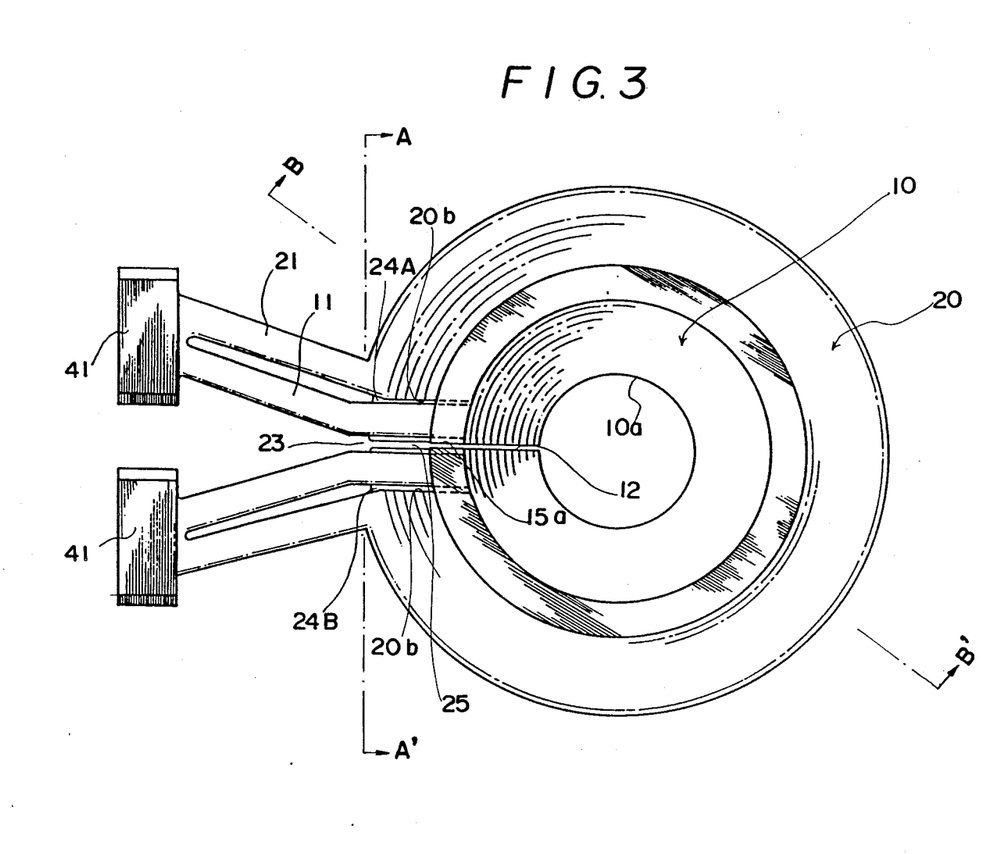
FIG. 3 is a top plan view.

According to the third aspect, even when the gap 20b between the both ends of the coil 20 are widened in order to afford various members such as power supply tubes 11 a space for disposing, the widened gap 20b can still be covered by the sector plates 24A and 24B with maximum adjacency between them just above the peripheral edge portion 4a to achieve a uniform magnetic field around the coil 20 and not to degrade the heating efficiency thereof.

In addition, according to the third aspect, since the thickness and tilting angle from the lower face of the coil 10 or 20 of the sector plates 24A and 24B can be arbitrarily changed, electromagnetic coupling of the coils 10 and 20 with the semiconductor rod 1 can be improved by the changes.

Furthermore, in the conventional single-turn induction heating coil, a ratio between the currents in the inner peripheral portion and in the outer peripheral portion is only changed by selecting a ratio of the inner diameter with the outer one. However, according to the third aspect, the thickness and size of the sector plates 24A and 24B are properly adjusted so as to locally increase the magnetic field intensity, and to increase flexibility in designing the coils 10 and 20.

BRIEF DESCRIPTION OF THE DRAWINGS

FIGS. 2(A) and 2(B) are schematic views showing a basic arrangement of a second aspect according to the present invention, in which FIGS. 2(C) and 2(D) are views of a modification showing a basic arrangement of the present invention, in which

FIGS. 3 to 6 are views showing an RF induction heating apparatus according to an embodiment of the first to third aspects, in which

DETAILED DESCRIPTION OF THE PREFERRED EMBODIMENT

A preferred embodiment of the present invention will be described in detail with reference to the accompanying drawings. Note that the scope of the invention is not limited to the sizes, the materials, the shapes, the relative positions, and the like of the components described in the embodiment, unless otherwise specified, and that they only exemplify the invention.

As shown in FIG. 3, a heating apparatus of the present invention comprises a first flat single-turn coil 10 (to be referred to as an inner coil 10 hereinafter) for zone-melting a polycrystalline material 2, and a second flat single-turn heating coil 20 (to be referred to as an outer coil 20 hereinafter) arranged to be concentric with the inner coil 10 while surrounding the inner coil 10 substantially in a level. These coils are connected to supporting bodies 41 with pairs of power supply tubes 11 and 21 parallelly extending outward from outer walls of the coils.

The arrangement of these members will be described in more detail below.

Each supporting body 41 is formed by a material of the same quality as that of the coils 10 and 20 and the power supply tubes 11 and 21, such as copper, silver, or a conductive material containing them. Openings (not shown) are arranged on the rear side of the supporting bodies 41 at which coolant supply tubes 42 are connected. The coolant flows through the tubes 42 in and out of the power supply tubes 11 and 12 and further the coils 10 and 20. In addition, an RF power supply 40 is connected to the tubes 42 to allow RF current to be fed in and out of the inner and outer coils 10 and 20, respectively, through the coolant supply tubes 42, the supporting bodies 41, and the power supply tubes 11 and 21.

The inner coil 10 is a hollow flat disc body having a substantially wedge-like section with a tip at the inside and having a gap 12 in a raidal direction thereof at both ends of the turn. The power supply tubes 11 (to be referred to as inner power supply tubes 11 hereinafter for specifying the other pairs) are respectively connected to the outer wall at the both ends opposing each other with the gap 12. The inner power supply tubes 11 extend along the radial direction and spread in a V shape, and then the distal ends thereof are fixed to the supporting bodies 41, respectively.

Figure 6:
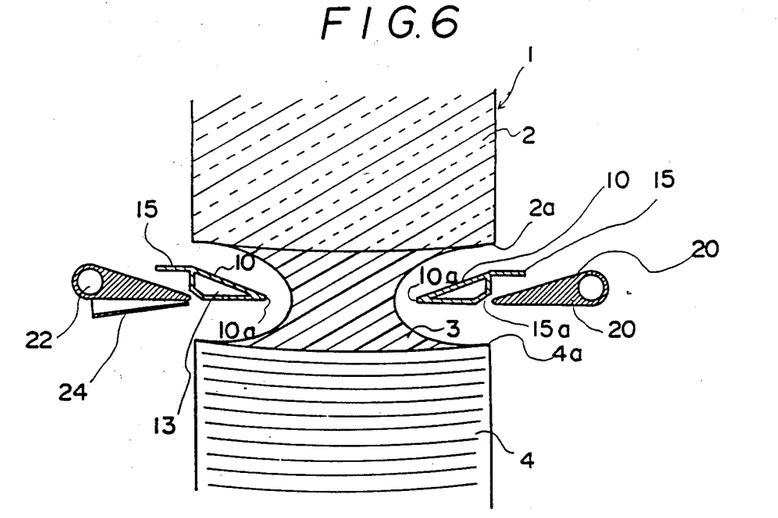

As shown in FIG. 6, a cross section of the inner coil 10 is designed such that an inner diameter 10a of the coil is smaller than a diameter of the polycrystalline material 2, the lower surface of the inner coil 10 is kept horizontal while the upper surface thereof is tapered downward toward the inner peripheral side, and the coolant guided from the power supply tubes 11 can be circulated through a hollow portion 13 therein.

An upper edge portion at the outer periphery of the coil 10 is surrounded by a ring-like collar 15 and coupled thereto so as to increase the outer diameter of the inner coil 10, while the lower peripheral edge portion of the coil 10 is chamfered and the inner periphery of the outer coil 20 is approached close to the chamfer, so that the inner peripheral side of the outer coil 20 and a peripheral edge portion 4a of a grown single-crystal semiconductor rod 4 can be easily adjusted to oppose each other, thereby effectively heating the peripheral edge portion 4a.

Figure 4:
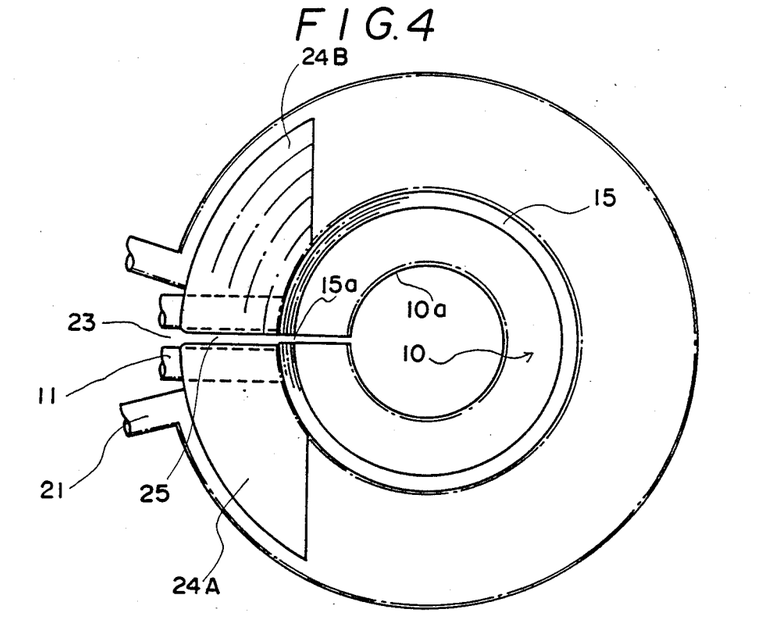
FIG. 4 is a bottom plan view.
Figure 5:
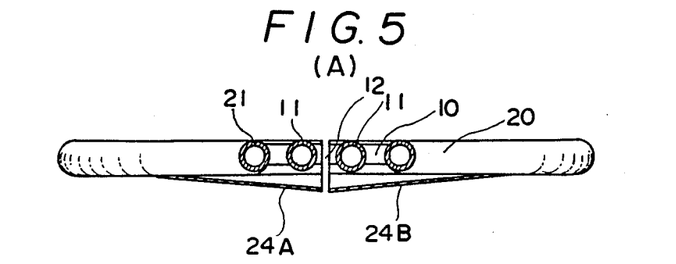
FIG. 5(A) is a cross-sectional view taken along the line A—A' in FIG. 3.
FIG. 5(B) is a cross-sectional view showing a modification thereof and FIG. 6 is a cross-sectional view taken along the line B—B' in FIG. 3 for showing a positional relationship between the apparatus and a semiconductor rod in a manufacturing state.

As shown in FIG. 4, the both ends of the ring-like collar 15 come close to an extended center line of the gap 12 and oppose each other with a gap 15a, thereby covering the power supply tubes 11 extending outward from the outer peripheral surface of the coil 10, and preventing nonuniform magnetic field around the gap 15a.

As a result, since the inner coil can be tapered toward the inner periphery and its width being radially increased by the collar 15, the magnetic field at the inner periphery of the coil 10, which is concentrated on the melting zone 3 to be heated is strengthened and a heating in the melting zone 3 gets efficient, so that even when the diameter of the polycrystalline material 2 is increased, the melting zone 3 can be stably and smoothly melted.

Note that the gap 12 of the inner coil 10 need not be necessarily formed to be vertical as shown in FIG. 5(A), but can be inclined in the peripheral direction as shown in FIG. 5(B), thereby further decreasing the nonuniform magnetic field generated near the gap 12.

The outer coil 20 is formed by a ring body having a wedge-like section at the inner periphery and surrounding the outer periphery of the inner coil 10. The both ends of the outer coil 20 are extended close to each other and the ends are positioned just above the inner power supply tubes 11. The outer power supply tubes 21, which parallelly extend along the outsides of the inner power supply tubes 11 are bent away from each other and the distal ends of the outer power supply tubes 21 are connected to in the supporting bodies 41 each to each.

As shown in FIG. 6, the inner diameter of the outer coil 20 is designed to be equal to or slightly larger than the diameter of the peripheral edge portion 4a of the growing semiconductor rod 4 interfacing the melting zone 3. In addition, the outer coil 20 has a cross section tapering toward the inner periphery and its lower surface is included in the same plane as that of the lower surface of the inner coil 10. A circular through hole 22 for guiding the coolant is formed in the outer peripheral portion of the outer coil 20, so that the coolant guided from the power supply tubes 21 can flow in and out of the through hole 22. Although the outer diameter of the coil 20 is not specifically limited in size, in order to concentrate the magnetic field generated around the coil 20 at the inner periphery, it is preferable that the thickness of the coil 20 is thinner and the width thereof is larger and what's more a current ratio of the inner coil 10 to the outer coil 20 is selected to be 1:10.

According to the aforementioned embodiment, since the inner and outer coils 10 and 20 are arranged substantially on a single plane as a whole while the inner coil 10 is flattened and its diameter is increased, the melting zone 3 can be further narrowed in spite of an increase in diameter of a single-crystal product. Because the outer coil 20 has the same level as that of the inner coil 10 positioned inward therefrom, the space 23 between the ends of the outer coil 20 cannot be reduced enough because of the physical interference of the inner power supply tubes 11 extending from the outer wall of the inner coil 10. As a result, disturbance of the magnetic field tends to occur in the space 23.

Therefore, in the embodiment, the pair of sector plates 24A and 24B same in size are mounted symmetrically about the center line of the gap 12 by fusing on a lower surface of the coil 20, which oppose the peripheral edge portion 4a of a growing single-crystal rod 4, so as to secure the uniform magnetic field around the space 23.

The arrangement of the sector plates 24A and 24B will be described in reference with FIGS. 4, and 5(A) and 5(B). The sector plates 24A and 24B are made of the same material as that of the coils, i.e., copper or silver, and the outer peripheries are arcuated to have substantially the same curvature as that of the outer periphery of the coil or slightly smaller than that thereof. When arcuated portions 26 and straight portions 27 of the profile of the sector plates 24A and 24B are mounted on the lower surface 20a of the coil by fusing, and besides the sector plates 24A and 24B are inclined downward in the direction of the outer periphery so that they come closer to the peripheral edge portion 4a while both ends 20b of the sector plates 24A and 24B maximally come close to each other, so as to level off the magnetic field in the neighborhood of the inner and outer power supply tubes 11 and 21.

As a result, the inner periphery of the outer coil 20 can be positioned to oppose the peripheral edge portion 4a of the growing single-crystal rod 4, and the sector plates 24A and 24B, i.e., a part of the coil 20 come close to the peripheral edge portion 4a, thereby improving the induction heating effect of the coils. Therefore, Floating Zone Melting can be smoothed and stabilized and therefore, the macroscopic and microscopic resistivity fluctuations otherwise conspicuously arising can be reduced substantially to nonexistence.

In addition, by properly changing the thickness and profile of the shielding plates 24, the intensity of the electromagnetic field can be locally increased. In another embodiment, the inner coil 10 can be eccentrically positioned to modify the induction heating effect on the temperature profile in the axial direction in the lower vicinity of the peripheral edge portion 4a to improve the crystallographic quality.

What is claimed is:

1. An RF induction heating apparatus arrangement for floating-zone melting a rod-like raw material semiconductor moving relative to said apparatus, said arrangement comprising a rod-like semiconductor, a first single-turn induction heating coil disposed around said rod-like semiconductor for floating-zone melting said rod-like raw material semiconductor, whereby a floating molten zone is established within said first heating coil in said rod-like semiconductor, said floating molten zone having a crystal growth interface at the bottom thereof, a second heating coil arranged below said first heating coil, and RF power source means connected to said first and second heating coils, wherein the inner periphery of said second heating coil is positioned adjacent the periphery of said crystal growth interface formed at the bottom of the floating zone in said rod-like semiconductor.

2. An RF induction heating arrangement as claimed in claim 1, wherein said second heating coil has an inner diameter larger than the inner diameter of said first heating coil.

3. An RF induction heating arrangement as claimed in claim 1, wherein the inner diameter of said first single-turn induction heating coil is smaller than the diameter of said rod-like raw material semiconductor; wherein the second heating coil is a single-turn induction heating coil having an outer diameter larger than the diameter of said rod-like raw material semiconductor, and wherein the inner diameter of said second heating coil is smaller than the outer diameter of said first heating coil.

4. An RF induction heating arrangement as claimed in claim 1, wherein said first single-turn induction heating coil and said second heating coil are connected in parallel to a common RF power source.

5. An RF induction heating apparatus for floating-zone melting a rod-like raw material semiconductor moving relative to said apparatus, said apparatus comprising a first single-urn induction heating coil for floating-zone melting said rod-like raw material semiconductor, and a second heating coil positioned outside the circumferential periphery of said first heating coil and having an inside diameter larger than the inside diameter of said first heating coil and an outside diameter larger than the outside diameter of said first heating coil, said first and second coils being positioned substantially concentrically in substantially the same horizontal plane, and an RF power source connected in parallel to said first and second heating coils.

6. An RF induction heating apparatus for floating-zone melting a rod-like raw material semiconductor moving relative to said apparatus, said apparatus comprising a first single-turn induction heating coil, a second heating coil positioned outside the circumferential periphery of said first heating coil, said first and second coils being positioned substantially concentrically in substantially the same horizontal plane, an annular flat plate connected to an outer peripheral edge of said first heating coil and extending substantially horizontally therefrom, said flat plate having an outer diameter larger than the inner diameter of said second heating coil, and an RF power source connected to said first and second heating coils.

7. An RF induction heating apparatus for floating-zone melting a rod-like raw material semiconductor moving relative to said apparatus, said apparatus comprising a first single-turn induction heating coil for floating-zone melting said rod-like raw material semiconductor, a second heating coil positioned on or below the plane of said first heating coil, at least one conductive sector plate affixed to the undersurface of said second heating coil, said conductive sector plate being inclined outwardly and downwardly in a circumferential direction along its outer peripheral edge to improve electromagnetic coupling of said second heating coil with the periphery of a crystal growth interface formed at the bottom of the floating zone in said rod-like semiconductor and an RF power source connected to said first and second heating coils.

8. An RF induction heating apparatus as claimed in claim 7, wherein said second heating coil and said conductive sector plate have substantially similar arcuate shapes; wherein the curvature of the arcuate portion of said conductive sector plate is smaller than the curvature of the arcuate portion of said second heating coil, and wherein the inner peripheral edge of said conductive sector plate is aligned with the inner peripheral edge of said second heating coil.

* * * * *